United States Patent
Tsai (10) Patent No.: US 9,633,590 B2
(45) Date of Patent: Apr. 25, 2017

(54) SEMICONDUCTOR STRUCTURE, DISPLAY PANEL AND CONTROL METHOD THEREOF

(71) Applicant: InnoLux Corporation, Miao-Li County (TW)

(72) Inventor: Chia-Hao Tsai, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 42 days.

(21) Appl. No.: 14/714,156

(22) Filed: May 15, 2015

(65) Prior Publication Data

US 2015/0332621 A1  Nov. 19, 2015

(30) Foreign Application Priority Data

May 19, 2014  (TW) .............................. 103117458 A (51) Int. Cl.
| | |
|---|---|
| *G09G 3/3266* | (2016.01) |
| *G09G 3/20* | (2006.01) |
| *H03K 17/687* | (2006.01) |
| *G11C 19/18* | (2006.01) |
| *G11C 19/28* | (2006.01) |

(52) U.S. Cl.
CPC ............. *G09G 3/20* (2013.01); *G11C 19/184* (2013.01); *G11C 19/28* (2013.01); *H03K 17/687* (2013.01); *G09G 2310/0267* (2013.01); *G09G 2310/0286* (2013.01)

(58) Field of Classification Search
CPC ............. G09G 3/20; G09G 2310/0286; G09G 2310/0267; G09G 3/3266; G11C 19/28; G11C 19/184; H03K 17/687
See application file for complete search history.

(56) References Cited

U.S. PATENT DOCUMENTS

| | | | | |
|---|---|---|---|---|
| 2008/0007296 | A1* | 1/2008 | Umezaki | .................. G09G 3/20 |
| | | | | 326/62 |
| 2009/0309100 | A1* | 12/2009 | Moriguchi | ........ H01L 29/66757 |
| | | | | 257/59 |
| 2013/0140569 | A1* | 6/2013 | Yoneda | ................... H01L 29/78 |
| | | | | 257/57 |
| 2013/0161607 | A1 | 6/2013 | Yoneda et al. | |

OTHER PUBLICATIONS

Chinese language office action dated Jan. 8, 2016, issued in application No. TW 103117458.

* cited by examiner

*Primary Examiner* — Premal Patel
(74) *Attorney, Agent, or Firm* — McClure, Qualey & Rodack, LLP (57) ABSTRACT

A semiconductor structure is provided. A first conductive layer is formed between a substrate and a first insulating layer. A semiconductor layer is disposed over the first insulating layer. A second conductive layer is formed between a semiconductor layer and a second insulating layer and includes a first segment and a second segment. A third conductive layer is disposed over the second insulating layer. The first insulating layer, the semiconductor layer, the first segment and the second segment constitute a first transistor. The third conductive layer, the semiconductor layer, the first segment and the second segment constitute a second transistor. During a first period, the first and third conductive layers receive a first voltage level and a second voltage level respectively. During a second period, the first and third conductive layers receive a third voltage level and a fourth voltage level respectively.

14 Claims, 7 Drawing Sheets

SEMICONDUCTOR STRUCTURE, DISPLAY PANEL AND CONTROL METHOD THEREOF

CROSS REFERENCE TO RELATED APPLICATIONS

This Application claims priority of Taiwan Patent Application No. 103117458, filed on May 19, 2014, the entirety of which is incorporated by reference herein.

BACKGROUND OF THE INVENTION

Field of the Invention

The invention relates to a semiconductor structure, and more particularly to a semiconductor structure with dual gates.

Description of the Related Art

Generally, each transistor is an electronic element with three terminals. Types of transistors include bipolar junction transistors (BJTs) and field effect transistors (FETs). Each of the FETs has three terminals comprising a gate, a source and a drain. Each FET has a threshold voltage. When the voltage difference between the gate and the source exceeds the threshold voltage, a channel is formed between the source and the drain. However, if the gate receives voltage for long periods of time, the threshold voltage shifts.

BRIEF SUMMARY OF THE INVENTION

In accordance with an embodiment, a semiconductor structure comprises a substrate, a first conductive layer, a first insulating layer, a semiconductor layer, a second conductive layer, a second insulating layer, and a third conductive layer. The first conductive layer is disposed over the substrate. The first insulating layer is disposed over the first conductive layer. The semiconductor layer is disposed over the first insulating layer. The second conductive layer is disposed over the semiconductor layer and comprises a first segment and a second segment. The second insulating layer is disposed over the second conductive layer. The third conductive layer is disposed over the second insulating layer. The first conductive layer, the semiconductor layer, the first segment and the second segment constitute a first transistor. The third conductive layer, the semiconductor layer, the first segment and the second segment constitute a second transistor. During a first period, the first conductive layer receives a first voltage level and the third conductive layer receives a second voltage level. During a second period, the first conductive layer receives a third voltage level and the third conductive layer receives a fourth voltage level.

A control method for a first transistor and a second transistor sharing a source and a drain is provided. An exemplary embodiment of a control method is described below. During a first period, a first voltage level is provided to a gate of the first transistor and a second voltage level is provided to a gate of the second transistor. During a second period, the voltage levels of the gates are changed.

In accordance with an embodiment, a display device comprises an element substrate, an opposite substrate and a display medium. The element substrate comprises the described semiconductor structure. The opposite substrate is opposite to the element substrate. The display medium is disposed between the element substrate and the opposite substrate.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Figure 1:
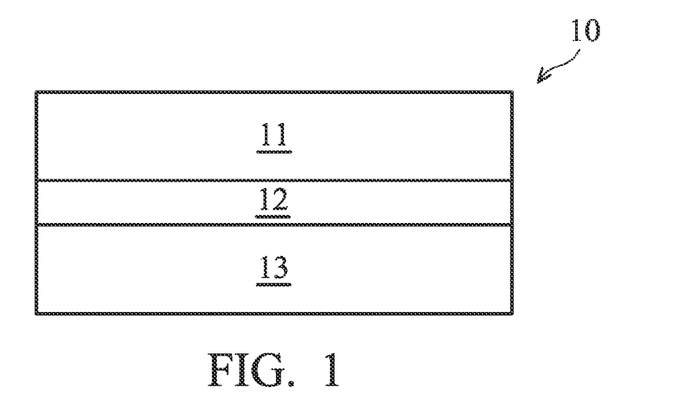
FIG. 1 is a schematic diagram of an exemplary embodiment of a display device, in accordance with some embodiments.

FIG. 1 is a schematic diagram of an exemplary embodiment of a display device, in accordance with some embodiments. The display device 10 comprises an opposite substrate 11, a display medium 12 and an element substrate 13. The opposite substrate 11 is opposite to the element substrate 13. The display medium 12 is disposed between the element substrate 13 and the opposite substrate 11.

Figure 2:
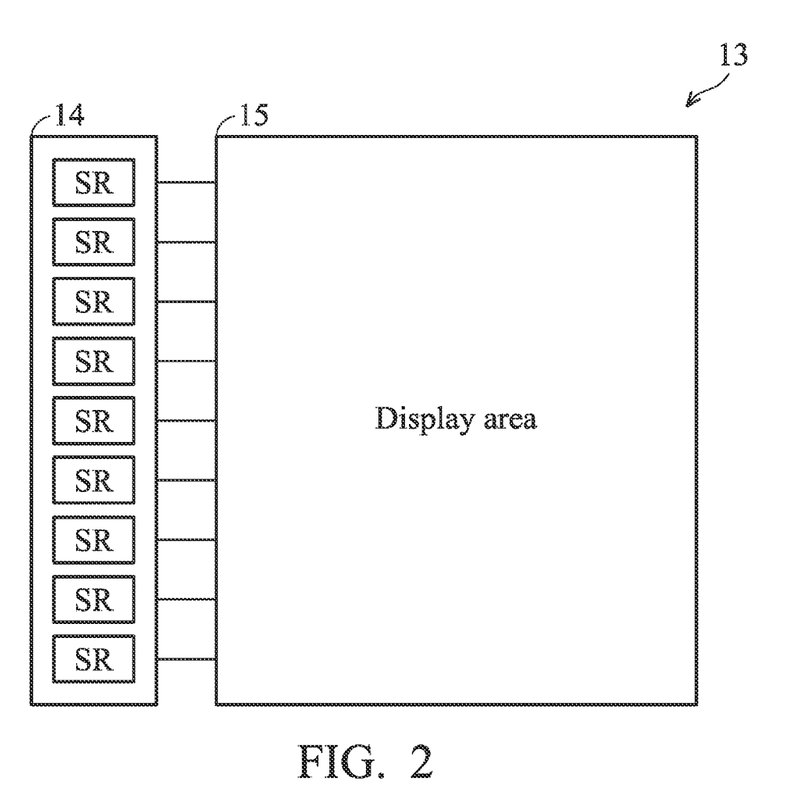
FIG. 2 is a schematic diagram of an exemplary embodiment of an element substrate, in accordance with some embodiments.

FIG. 2 is a schematic diagram of an exemplary embodiment of an element substrate, in accordance with some embodiments. The element substrate 13 comprises a gate driving circuit 14 and a display area 15. The invention does not limit the structure of the gate driving circuit 14. In one embodiment, the gate driving circuit 14 comprises a plurality of shift registers SR. The shift registers SR are connected in series.

Figure 3:
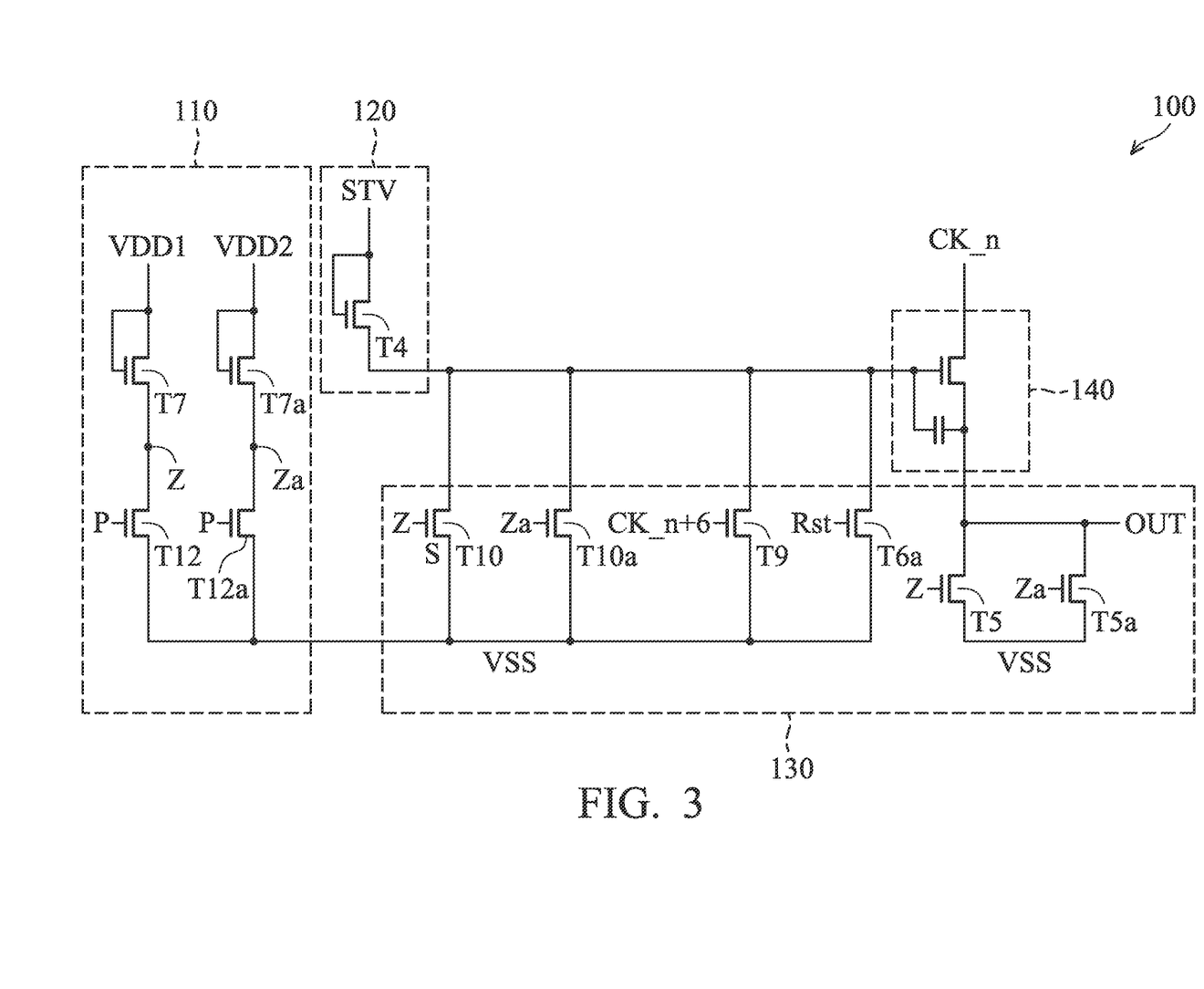
FIG. 3 is a schematic diagram of an exemplary embodiment of a control circuit, in accordance with some embodiments.

FIG. 3 is a schematic diagram of an exemplary embodiment of a control circuit, in accordance with some embodiments. The control circuit 100 comprises a first control unit 110, a second control unit 120, a pull-low unit 130 and a pull-up unit 140. The first control unit 110 is configured to control the pull-down unit 130. The second control unit 120 is configured to control the pull-up unit 140. The pull-down unit 130 pulls the voltage level of the output node OUT to a level VSS. The pull-up unit 140 is configured to enable the voltage level of the output node OUT to follow the signal CK_n. In this embodiment, the control circuit 100 serves as one of the shift registers SR shown in FIG. 2.

As shown in FIG. 3, the pull-down 130 comprises transistors T10 and T10a. The drains of the transistors T10 and T10a are coupled to the node P, the drains of the transistors T10 and T10a receive the level VSS. The gates of the transistors T10 and T10a receive signals Z and Za respectively. The signal Z is inverted to the signal Za. In other words, when one of the transistors T10 or T10a is turned on, the other of the transistors T10a or T10 is turned off.

Figure 4A:
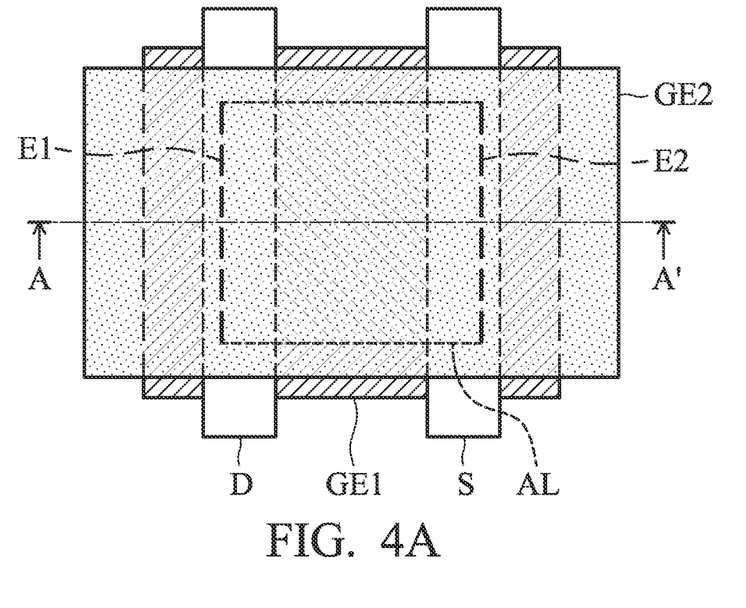
FIGS. 4A~4D are top-view diagrams of semiconductor structures, in accordance with some embodiments.

FIGS. 4A~4D are top-views of semiconductor structure, in accordance with some embodiments. In one embodiment, each of the semiconductor structures shown in FIGS. 4A~4D is applied in one of the shift registers SR shown in FIG. 2. Refer to FIG. 4A, the drain D and the source S are disposed between the gates GE1 and GE2. The active layer AL contacts with the drain D and the source S. The invention does not limit the relationship between the active layer AL and the drain D and the source S. In this embodiment, the drain D overlaps an end of a first side E1 of the active layer AL and the source S overlaps an end of a second side E2 of the active layer AL. In other embodiments, the drain D does not overlap the end of the first side E1 of the active layer AL and the source S does not overlap the end of the second side E2 of the active layer AL. In other words, the first side E1 of the active layer AL extends to the left of the drain D and passes the left side of the drain D, and the second side E2 of the active layer AL extends to the right of the source S and passes the right side of the source S.

Figure 4B:
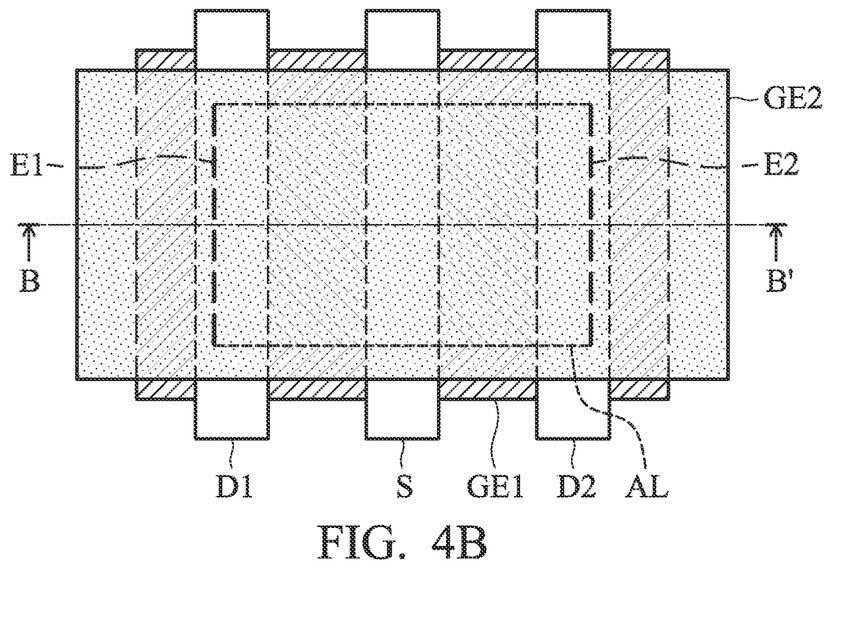
Figure 4C:
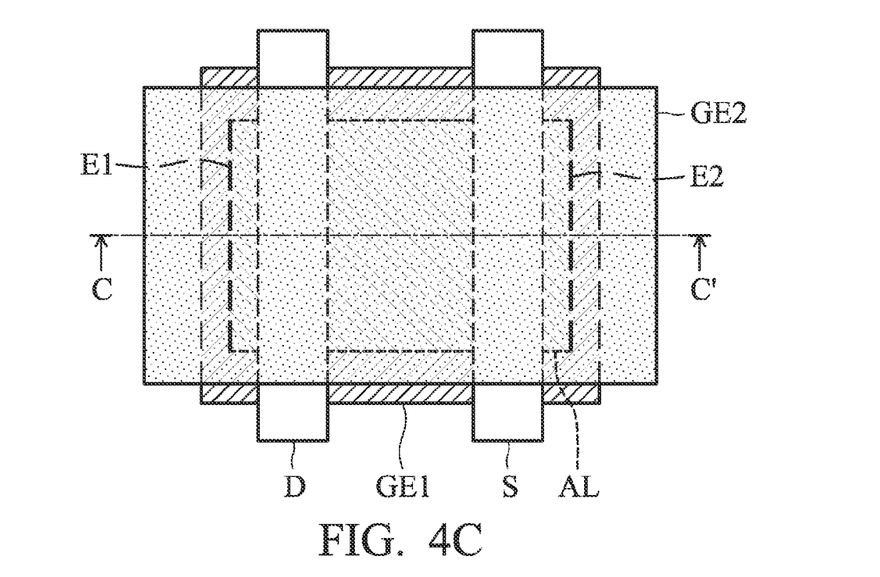

As illustrated in FIGS. 4A and 4C, the gate GE1, the active layer AL, the drain D and the source S constitute a first transistor, and the gate GE2, the active layer AL, the drain D and the source S constitute a second transistor. Taking the transistors T10 and T10a of FIG. 3 as an example, when the gate GE1 receives the signal Z, the drain D is coupled to the node P and the source S receives the level VSS, the first transistor serves as the transistor T10. Similarly, if the signal Za is provided to the gate GE2, the second transistor serves as the transistor T10a.

In this embodiment, since the transistors T10 and T10a share a source S and a drain D, the semiconductor structure shown in FIGS. 4A and 4C is referred to as a two-in-one structure. The two-in-one structure achieves two transistors so that the space occupied by the circuit is reduced. If the sharing technology is applied to a driving circuit of a display, the border space of the display can be reduced.

However, the two-in-one structure is not only applicable for use in a display. Any structure can use the two-in-one structure, as long as the structure comprises two transistors and the transistors' sources are connected to each other and the transistors' drains are connected to each other. In FIG. 3, the two-in-one structure shown in FIG. 4A or 4C can be applied to achieve the transistors T5 and T5a or T9 and T6a in the pull-down unit 130. For example, when the gate GE1 shown in FIG. 4A or 4C receives a signal Z, the gate GE2 shown in FIG. 4A or 4C receives a signal Za, the drain D shown in FIG. 4A or 4C is coupled to an output node OUT and the source S shown in FIG. 4A or 4C receives a level VSS, the structure shown in FIG. 4A or 4C can achieve the transistors T5 and T5a. Additionally, if the drain D shown in FIG. 4A or 4C is coupled to a node P and the source S shown in FIG. 4A or 4C receives a level VSS, the structure shown in FIG. 4A or 4C can achieve the transistors T9 and T6a.

Figure 4D:
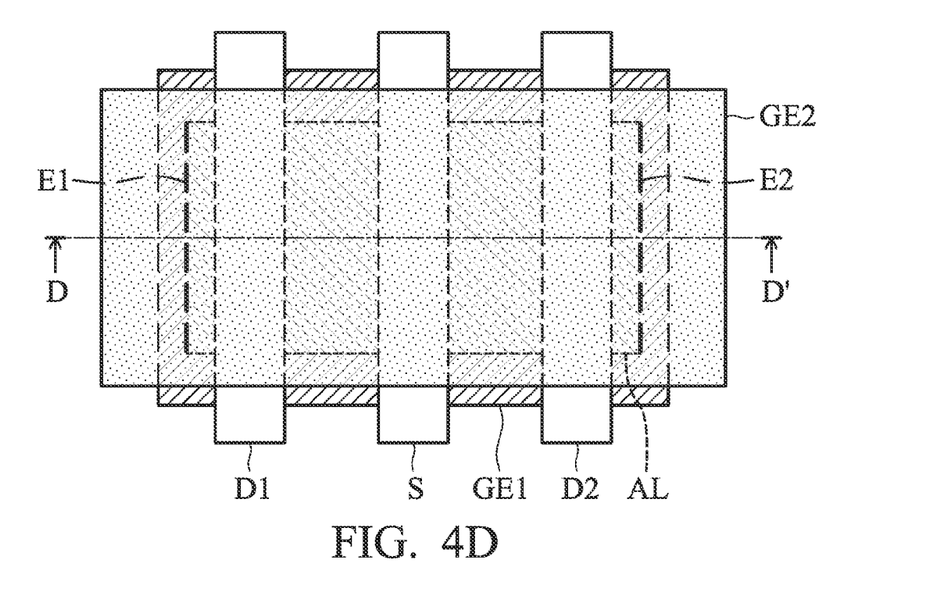

Refer to FIGS. 4B and 4D, the source S and the drains D1 and D2 are disposed between the gates GE1 and GE2, and the active layer AL contacts the drains D1 and D2 and the source S. In FIG. 4B, the drain D1 overlaps the end of the first side E1 of the active layer AL, and the drain D2 overlaps the end of the second side E2 of the active layer AL. In FIG. 4D, the drain D1 does not overlap the end of the first side E1 of the active layer AL and the drain D2 does not overlap the end of the second side E2 of the active layer AL.

In this embodiment, the gate GE1, the active layer AL, the source S and the drain D1 constitute a first transistor. The gate GE2, the active layer AL, the source S and the drain D1 constitute a second transistor. The gate GE1, the active layer AL, the source S and the drain D2 constitute a third transistor. The gate GE2, the active layer AL, the source S and the drain D2 constitute a fourth transistor.

In one embodiment, the gates GE1 and GE2, the source S, and the drains D1 and D2 receive the corresponding signal such that the first, second, third and fourth transistors respectively serve as the transistors T10, T10a, T5 and T5a shown in FIG. 3. In this embodiment, the first, second, third and fourth transistors share a single source. Therefore, each of the structures shown in FIGS. 4B and 4D is referred to as a four-in-one structure. Compared with the two-in-one structure, the four-in-one structure further reduces the space of the circuit. Taking FIG. 3 as an example, a first two-in-one structure achieves the transistors T10 and T10a, a second two-in-one structure achieves the transistors T9 and T6a, and a third two-in-one structure achieves the transistors T5 and T5a.

In another embodiment, a two-in-one structure achieves the transistors T9 and T6a and a four-in-one structure achieves the transistors T10, T10a, T5 and T5a. Since the gate signals of the transistors T9 and T6a are different from the gate signals of the transistors T5 and T5a, the transistors T9, T6a, T5 and T5a cannot be achieved by a four-in-one structure.

Figure 5A:
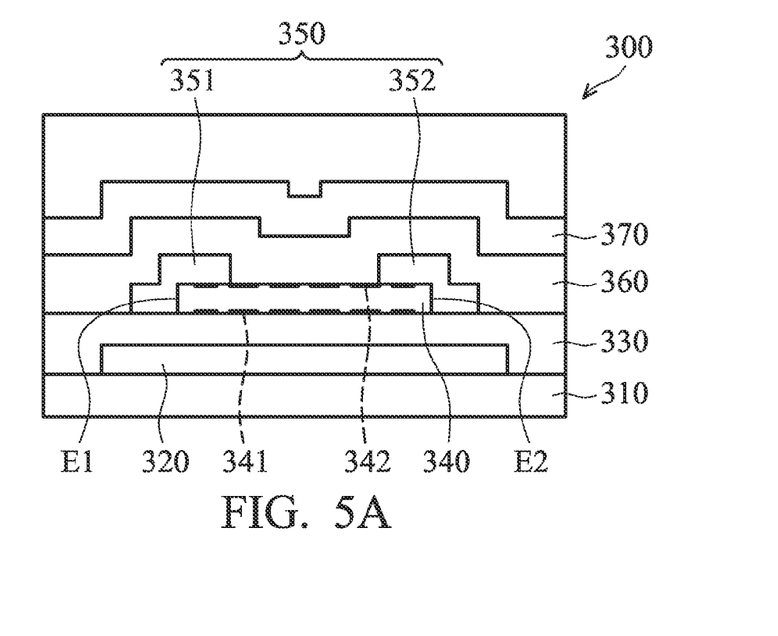
FIGS. 5A~5D show cross sections along lines A-A', B-B', C-C' and D-D' of FIGS. 4A~4D, in accordance with some embodiments.

FIGS. 5A~5D show cross sections along lines A-A', B-B', C-C' and D-D' of FIGS. 4A~4D, in accordance with some embodiments. Refer to FIG. 5A, the semiconductor structure 300 comprises a substrate 310, a first conductive layer 320, a first insulating layer 330, a semiconductor layer 340, a second conductive layer 350, a second insulating layer 360 and a third conductive layer 370. In this embodiment, the semiconductor structure 300 is formed by a back channel etched technology, but the disclosure is not limited thereto. In other embodiments, the semiconductor structure 300 may be formed by an etching stop layer technology.

The first conductive layer 320 is disposed over the substrate 310. The first insulating layer 330 is disposed over the first conductive layer 320. The semiconductor layer 340 is disposed over the first insulating layer 330. In this embodiment, the semiconductor layer 340 serves as an active layer. In one embodiment, the semiconductor layer 340 is constituted by A-si, LTPS, oxide semiconductor, such as IGZO. When a signal is generated, the semiconductor layer 340 is turned on. When no signal is generated, the semiconductor layer 340 serves as an insulating layer.

The second conductive layer 350 is disposed over the semiconductor layer 340 and comprises a first segment 351 and a second segment 352. The first segment 351 is independent of the second segment 352. In this embodiment, the first segment 351 overlaps the first side E1 of the semiconductor layer 340, and the second segment 352 overlaps the second side E2 of the semiconductor layer 340. The second insulating layer 360 is disposed over the second conductive layer 350. The third conductive layer is disposed over the second insulating layer 360.

In this embodiment, the first conductive layer 320, the semiconductor layer 340, the first segment 351, and the second segment 352 constitute a first transistor, wherein the first conductive layer 320 serves as a gate of the first transistor, the first segment 351 serves as a source of the first transistor, and the second segment 352 serves as a drain of the first transistor. Additionally, the third conductive layer 370, the semiconductor layer 340, the first segment 351, and the second segment 352 constitute a second transistor, wherein the third conductive layer 370 serves a gate of the second transistor, the first segment 351 serves as a source of the second transistor and the second segment 352 serves as a drain of the second transistor.

In this embodiment, a first voltage level is provided to the first conductive layer 320 and a second voltage level is provided to the third conductive layer 370 during a first period such that the first transistor is turned on and the second transistor is turned off. During a second period, the voltage levels of the first conductive layer 320 and the third conductive layer 370 are changed to turn off the first transistor and turn on the second transistor.

In one embodiment, a third voltage level is provided to the first conductive layer 320 and a fourth voltage level is provided to the third conductive layer 370 during a second period. The third voltage level may or may not be equal to the second voltage level. The fourth voltage level may be equal to or unequal to the first voltage level. In other embodiments, the first voltage level is a positive voltage level, such as +19V, and the second voltage level is a negative voltage level, such as −5V.

Since the first transistor and the second transistor are alternately turned on, carriers are not trapped in the same channel for long periods of time. Refer to FIG. 5A, when the first transistor is turned on and the second transistor is turned off, carriers are trapped in the lower surface 341 of the semiconductor layer 340. When the number of the trapped carriers is enough, a first channel is formed in the lower surface 341. When the first transistor is turned off and the second transistor is turned on, carriers move to the higher surface 342 of the semiconductor layer 340 and a second channel is formed in the higher surface 342. Therefore, carriers are not trapped in the same channel of the semiconductor structure shown in FIG. 5A.

However, in a conventional structure, when a transistor is turned on for long periods of time, carriers are trapped in a single channel for long time such that the threshold voltage of the transistor is shifted. When the environment temperature increases, the shifting issue is worsened. To solve the shifting issue, conventional technology increases the size of the transistor such that the space of the circuit is reduced. However, the described two-in-one structure alternately turns on two transistors such that carriers are not trapped in the same channel to avoid the shifting issue.

In another embodiment, if the semiconductor structure shown in FIG. 4A is applied to a display, the first period may be the duration of a first frame and the second period may be the duration of a second frame. In other words, the first period is one of the odd frames of the display and the second period is one of the even frames of the display. In addition, the invention does not limit the voltage levels of the first segment 351 and the second segment 352. In one embodiment, the first segment 351 and the second segment 352 receive suitable voltage levels during the first period. During the second period, the voltage levels of the first segment 351 and the second segment 352 are maintained. In another embodiment, the voltage levels of the first segment 351 and the second segment 352 are changed.

Figure 5B:
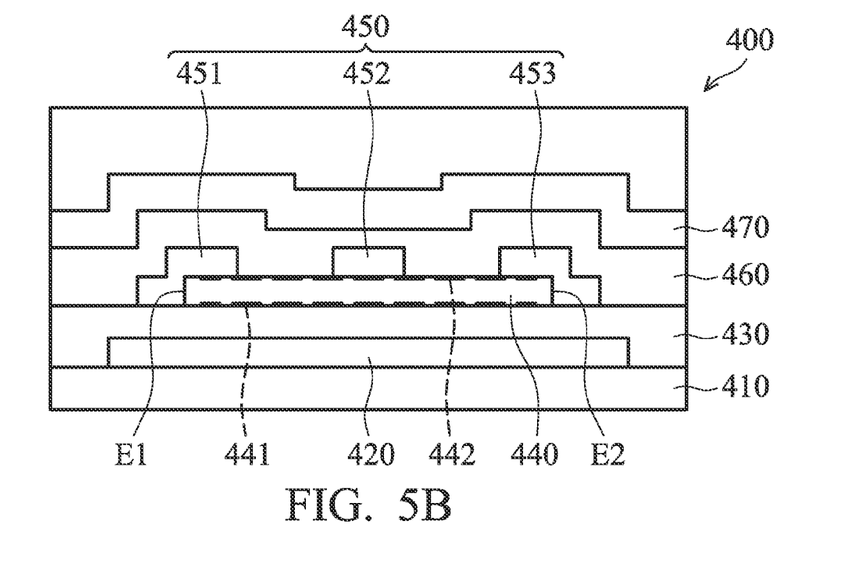

FIG. 5B shows a cross section along line B-B' of FIG. 4B. FIG. 5B is similar to FIG. 5A with the exception that the second conductive layer 450 comprises a first segment 451, a second segment 452 and a third segment 453. The first segment 451 separates from the second segment 452 and the third segment 453, and the second segment 452 separates from the third segment 453. In this embodiment, the first conductive layer 410, the semiconductor layer 440, the first segment 451 and the second segment 452 constitute a first transistor, wherein the first conductive layer 410 serves as a gate of the first transistor, the first segment 451 serves as a source or a drain of the first transistor, and the second segment 452 serves as a drain or a source of the first transistor. In one embodiment, the first transistor serves as the transistor T10 shown in FIG. 3.

The third conductive layer 470, the semiconductor layer 440, the first segment 451 and the second segment 452 constitute a second transistor. The third conductive layer 470 serves as a gate of the second transistor, the first segment 451 serves as a drain or a source of the second transistor and the second segment 452 serves as a source or a drain of the second transistor. In one embodiment, the second transistor serves as the transistor T10a shown in FIG. 3.

The first conductive layer 410, the semiconductor layer 440, the second segment 452 and the third segment 453 constitute a third transistor. The first conductive layer serves as a gate of the third transistor, the second segment 452 serves as a source or a drain of the third transistor, and the third segment 453 serves as a drain or a source of the third transistor. In one embodiment, the third transistor is capable of serving as the transistor T5 shown in FIG. 3.

The third conductive layer 470, the semiconductor layer 440, the second segment 452 and the third segment 453 constitute a fourth transistor. The third conductive layer 470 serves as a gate of the fourth transistor, the second segment 452 serves as a source of a drain of the fourth transistor, and the third segment 453 serves as a drain or a source of the fourth transistor. In one embodiment, the fourth transistor is capable of serving as the transistor T5a of FIG. 3.

In other embodiments, the numbers of the drains and the sources on the semiconductor layer 440 are adjusted to combine various transistors in a single structure. For example, if the second conductive layer 450 disposed over the semiconductor layer 440 comprises four segments, a six-in-one structure is provided. In other words, six transistors are combined in the same semiconductor structure.

Figure 5C:
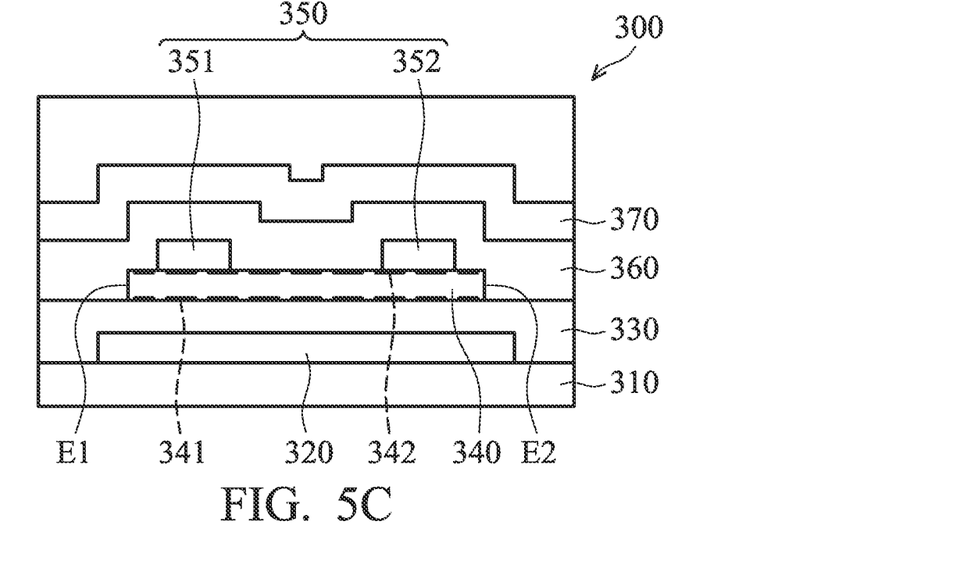

FIG. 5C is similar to FIG. 5A with the exception that the first segment 351 does not overlap the end of the first side E1 of the semiconductor layer 340 and the second segment 352 does not overlap the end of the second side E2 of the semiconductor layer 340. Since FIG. 5A and 5C operate on the same principle, the descriptions of FIG. 5C are omitted for brevity.

Figure 5D:
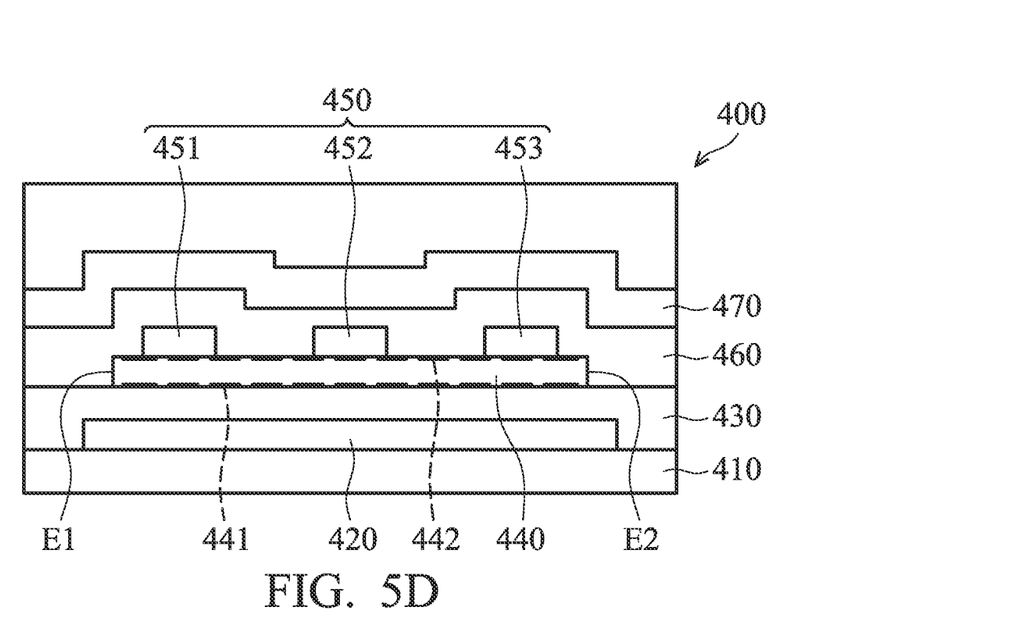

Furthermore, FIG. 5D is similar to FIG. 5B with the exception that the first segment 451 does not overlap the end of the first side E1 of the semiconductor layer 440 and the third segment 453 does not overlap the end of the second side E2 of the semiconductor layer 440. Since FIGS. 5B and 5D operate on the same principle, the descriptions of FIG. 5D are omitted for brevity.

Figure 6:
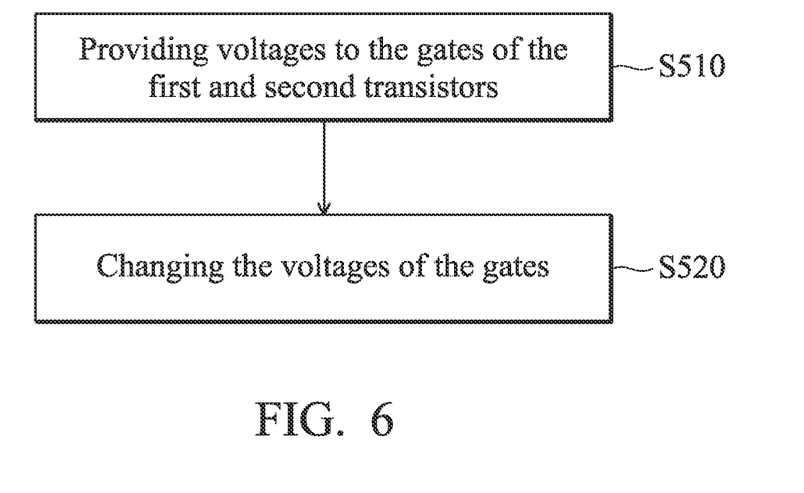
FIG. 6 is a flowchart of an exemplary embodiment of a control method, in accordance with some embodiments.

FIG. 6 is a flowchart of an exemplary embodiment of a control method, in accordance with some embodiments. The control method controls a first transistor and a second transistor. The first and second transistors share a single source and a single drain. In other embodiment, the control method is capable of controlling four transistors. The four transistors share a single source and a single drain or share two sources and two drains.

During a first period, a first voltage level is provided to the gate of the first transistor and a second voltage level is provide to the gate of the second transistor (step S510). In one embodiment, when the gate of the first transistor receives the first voltage level, the first transistor is turned on. When the gate of the second transistor receives the second voltage level, the second transistor is turned off.

The invention does not limit the polarities of the first and second voltage levels. In one embodiment, the first and second voltage levels are positive or negative voltage levels. In this embodiment, the first voltage level is a positive voltage level and the second voltage level is a negative voltage level.

During a second period, the voltage levels of the gates of the first and second transistors are changed (step S520). In one embodiment, a third voltage level is provided to the gate of the first transistor, and a fourth voltage level is provided to the gate of the second transistor. The third voltage level may be equal to or unequal to the second voltage level. The fourth voltage level may be equal to or unequal to the first voltage level. In one embodiment, the first voltage level is +19V and the second voltage level is −5V.

In other embodiments, a fifth voltage level is provided to the drains of the first and second transistors and a sixth voltage level is provided to the sources of the first and second transistor during the first period. During the second period, at least one of the fifth and sixth voltage levels is maintained.

Since the transistors with a sharing structure are alternately turned on, carriers are not trapped in the same channel for long periods of time. Therefore, the shifting issue of the threshold voltage of the transistor can be reduced. Additionally, the sharing structure increases the usable space of the circuit.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
   a substrate;
   a first conductive layer disposed over the substrate;
   a first insulating layer disposed over the first conductive layer;
   a semiconductor layer disposed over the first insulating layer;
   a second conductive layer disposed over the semiconductor layer and comprising a first segment and a second segment;
   a second insulating layer disposed over the second conductive layer; and
   a third conductive layer disposed over the second insulating layer,
   wherein the first conductive layer, the semiconductor layer, the first segment and the second segment constitute a first transistor, the third conductive layer, the semiconductor layer, the first segment and the second segment constitute a second transistor,
   wherein during a first period, the first conductive layer receives a first voltage level and the third conductive layer receives a second voltage level, and during a second period, the first conductive layer receives a third voltage level and the third conductive layer receives a fourth voltage level.

2. The semiconductor structure as claimed in claim 1, wherein the third voltage level is equal to the second voltage level and the fourth voltage level is equal to the first voltage level.

3. The semiconductor structure as claimed in claim 1, wherein the third voltage level is unequal to the second voltage level and the fourth voltage level is unequal to the first voltage level.

4. The semiconductor structure as claimed in claim 1, wherein first voltage level is a positive voltage level and the second voltage level is a negative voltage level.

5. The semiconductor structure as claimed in claim 1, wherein during the first period, the first transistor is turned on and the second transistor is turned off, and during the second period, the second transistor is turned on and the first transistor is turned off.

6. The semiconductor structure as claimed in claim 1, wherein a voltage level of the first segment and a voltage level of the second segment are maintained.

7. The semiconductor structure as claimed in claim 1, wherein the second conductive layer further comprises a third segment, the first conductive layer, the semiconductor layer, the second segment and the third segment constitute a third transistor, and the third conductive layer, the semiconductor layer, the second segment and the third segment constitute a fourth transistor.

8. A display device comprising:
   an element substrate comprising a semiconductor structure, the semiconductor structure, comprising:
   a substrate;
   a first conductive layer disposed over the substrate;
   a first insulating layer disposed over the first conductive layer;
   a semiconductor layer disposed over the first insulating layer;
   a second conductive layer disposed over the semiconductor layer and comprising a first segment and a second segment;
   a second insulating layer disposed over the second conductive layer; and
   a third conductive layer disposed over the second insulating layer,
   wherein the first conductive layer, the semiconductor layer, the first segment and the second segment constitute a first transistor, the third conductive layer, the semiconductor layer, the first segment and the second segment constitute a second transistor,
   wherein during a first period, the first conductive layer receives a first voltage level and the third conductive layer receives a second voltage level, and during a second period, the first conductive layer receives a third voltage level and the third conductive layer receives a fourth voltage level;
   an opposite substrate opposite to the element substrate; and
   a display medium disposed between the element substrate and the opposite substrate.

9. The display device as claimed in claim 8, wherein the element substrate comprises a shift register comprising the semiconductor structure.

10. The display device as claimed in claim 8, wherein the third voltage level is equal to the second voltage level and the fourth voltage level is equal to the first voltage level.

11. The display device as claimed in claim 8, wherein the third voltage level is unequal to the second voltage level and the fourth voltage level is unequal to the first voltage level.

12. The display device as claimed in claim 8, wherein first voltage level is a positive voltage level and the second voltage level is a negative voltage level.

13. The display device as claimed in claim 8, wherein during the first period, the first transistor is turned on and the second transistor is turned off, and during the second period, the second transistor is turned on and the first transistor is turned off.

14. The display device as claimed in claim 8, wherein the second conductive layer further comprises a third segment, the first conductive layer, the semiconductor layer, the second segment and the third segment constitute a third transistor, and the third conductive layer, the semiconductor layer, the second segment and the third segment constitute a fourth transistor.

* * * * *